United States Patent
Aratani

(10) Patent No.: US 11,917,751 B2
(45) Date of Patent: Feb. 27, 2024

(54) MULTILAYER WIRING BOARD AND METHOD OF PRODUCING THE SAME

(71) Applicant: TOPPAN INC., Tokyo (JP)

(72) Inventor: Masao Aratani, Tokyo (JP)

(73) Assignee: TOPPAN INC., Tokyo (JP)

( * ) Notice: Subject to any disclaimer, the term of this patent is extended or adjusted under 35 U.S.C. 154(b) by 77 days.

(21) Appl. No.: 17/534,936

(22) Filed: Nov. 24, 2021

(65) Prior Publication Data

US 2022/0087016 A1    Mar. 17, 2022

Related U.S. Application Data

(63) Continuation of application No. PCT/JP2020/020760, filed on May 26, 2020.

(30) Foreign Application Priority Data

May 31, 2019   (JP) .................. 2019-102736

(51) Int. Cl.
*H05K 1/11* (2006.01)
*H05K 1/02* (2006.01)
(Continued)

(52) U.S. Cl.
CPC ........... *H05K 1/0298* (2013.01); *H05K 1/115* (2013.01); *H05K 3/18* (2013.01); *H05K 3/467* (2013.01);
(Continued)

(58) Field of Classification Search
CPC ........ H05K 1/0298; H05K 1/115; H05K 3/18; H05K 3/467; H05K 2201/09545;
(Continued)

(56) References Cited

U.S. PATENT DOCUMENTS 6,674,017 B1 * 1/2004 Yamasaki .............. H05K 3/421
29/853
2006/0141762 A1   6/2006 Khandekar et al.
(Continued)

FOREIGN PATENT DOCUMENTS

JP    2002-314256 A    10/2002
JP    2002-319767 A    10/2002
(Continued)

OTHER PUBLICATIONS

Extended European Search Report issued in corresponding European Patent Application No. 20815677.8 dated Jun. 29, 2022.
(Continued)

*Primary Examiner* — Steven T Sawyer
(74) *Attorney, Agent, or Firm* — Foley & Lardner LLP

(57) ABSTRACT

A multilayer wiring board that improves the reliability of connection at a via hole connection portion, and a method for producing the multilayer wiring board. In a multilayer wiring board comprising a plurality of metal wiring layers alternately laminated with insulating layers interposed therebetween are electrically connected to each other via a via hole plated layer, wherein a dissimilar metallic layer, made from material different from that of the metal wiring layers, is interposed between each of the metal wiring layers on the bottom surface of the via hole and the via hole plated layer, and the dissimilar metallic layer interposed between the each of the metal wiring layers on the bottom surface of the via hole and the via hole plated layer is arranged in a concave shape on the surface of the concave portion formed in the metal wiring layer on the bottom surface of the via hole.

2 Claims, 6 Drawing Sheets

(51) Int. Cl.
*H05K 3/18* (2006.01)
*H05K 3/46* (2006.01)

(52) U.S. Cl.
CPC ............... *H05K 2201/0344* (2013.01); *H05K 2201/09509* (2013.01); *H05K 2201/09545* (2013.01); *H05K 2201/09745* (2013.01); *H05K 2201/09827* (2013.01); *H05K 2201/09845* (2013.01)

(58) Field of Classification Search
CPC ...... H05K 3/0035; H05K 3/108; H05K 3/388; H05K 3/4644; H05K 2201/0338; H05K 2201/0344; H05K 2201/09509; H05K 2201/09745; H05K 2201/09827; H05K 2201/09845; H05K 2203/054; H05K 3/421; H05K 1/116; H05K 1/11; H05K 3/07; H05K 3/26; H05K 3/46; H05K 2203/05
See application file for complete search history.

(56) References Cited

U.S. PATENT DOCUMENTS

| | | | |
|---|---|---|---|
| 2010/0212947 A1 | 8/2010 | Yamanaka et al. | |
| 2012/0103667 A1 | 5/2012 | Ito et al. | |
| 2014/0353025 A1* | 12/2014 | Jang | H05K 3/421 29/829 |
| 2015/0250054 A1* | 9/2015 | Yoshikawa | H01L 25/105 361/767 |
| 2016/0050769 A1* | 2/2016 | Yoshida | H05K 1/0298 216/18 |
| 2016/0133553 A1 | 5/2016 | Park | |
| 2016/0242278 A1* | 8/2016 | Yoshida | H05K 3/4652 |
| 2017/0150603 A1 | 5/2017 | Yamamura | |
| 2018/0166372 A1* | 6/2018 | Shimizu | H05K 3/4644 |
| 2020/0113061 A1 | 4/2020 | Habu et al. | |

FOREIGN PATENT DOCUMENTS

| | | |
|---|---|---|
| JP | 2006-032476 A | 2/2006 |
| JP | 2009-295850 A | 12/2009 |
| JP | 2012-94734 A | 5/2012 |
| JP | 2017-98422 A | 6/2017 |
| JP | 2017-157758 A | 9/2017 |

OTHER PUBLICATIONS

International Searching Authority, "International Search Report," issued in connection with International Patent Application No. PCT/JP2020/020760, dated Sep. 1, 2020, 5 pages.

International Searching Authority, "Written Opinion," issued in connection with International Patent Application No. PCT/JP2020/020760, dated Sep. 1, 2020, 4 pages.

* cited by examiner

MULTILAYER WIRING BOARD AND METHOD OF PRODUCING THE SAME

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2020/020760, filed on May 26, 2020, which is based upon and claims the benefit of priority to Japanese Patent Application No. 2019-102736, filed on May 31, 2019; the disclosures of which are incorporated herein by reference in their entireties.

TECHNICAL FIELD

The present invention relates to a technique for multilayer wiring boards.

BACKGROUND

Multilayer wiring boards are sometimes used as wiring boards for various types of electrical products. The multilayer wiring boards are designed on request to increase the circuit density to have an increased number of circuit patterns in the form of an insulating resin interposed between the layers of each circuit pattern. As this type of multilayer wiring board, there is known a method of forming a bottomed hole (via hole) in an insulating layer on a substrate, and electrically connecting circuit patterns on different layers (metal wiring layers) via the bottomed hole.

This type of multilayer circuit board is configured such that conductive layers (metal wiring layers) and insulating layers are alternately laminated. The circuit patterns on the conductive layers are electrically connected at interlayer connection portions formed by making holes in the insulating layers between the circuit patterns as necessary.

FIGS. 1 and 2 are enlarged cross-sectional views of examples of the conventional multilayer wiring board described above.

FIG. 1 is an enlarged cross-sectional view of a multilayer wiring board in which circuit patterns on layers (a first metal wiring layer 21, a second metal wiring layer 22, and a third metal wiring layer 23) and interlayer connection wires (a first via hole plated layer 61 and a second via hole plated layer 62) are formed of the same type of metallic material. FIG. 2 is an enlarged cross-sectional view of a multilayer wiring board formed of two or more types of metallic materials. FIGS. 1 and 2 show multilayer wiring boards in which three conductive layers are formed on one side of multilayer wiring board.

The electrical connection between the conductive layers in FIGS. 1 and 2 is achieved by forming via holes 41 and 42 by photolithography or by ablating the insulating layers 3 with a laser beam to reach a target that is the conductive layer, and forming the via hole plated layers 61 and 62 that are simultaneously formed when forming patterns on wall surfaces of the via holes 41 and 42. In the examples shown in FIGS. 1 and 2, the first metal wiring layer 21, the second metal wiring layer 22, and the third metal wiring layer 23 are electrically connected via the via hole plated layers 61 and 62.

A seed layer serving as a power supply layer for plating is required for forming the via hole plated layers 61 and 62. In the example shown in FIG. 1, the seed layer is made from material same as that of the wiring material, whereas in the example shown in FIG. 2, the seed layer is made from material different from that of the wiring material.

In recent years, there has been a demand for smaller, thinner multilayer wiring boards and finer wiring line widths. Thus, wiring layers are generally formed by forming films of metals different from a wiring material (a first dissimilar metallic layer 51 and a second dissimilar metallic layer 52) on the seed layers of electrolytic plating, as illustrated in FIG. 2, by dry processing such as sputter coating.

In the case of forming films of metals different from the wiring material onto the seed layers of electrolytic plating as illustrated in FIG. 2, the wiring layers at the bottom portions of the via holes 41 and 42 are separated by the dissimilar metallic layers 51 and 52. In recent wiring boards, the via hole diameters (cross sections of the opening) is reduced due to a need to downsize wiring boards, and the wiring connection area at the bottom portion of the via hole is reduced. In this case, as in the example shown in FIG. 2, cracks or ruptures may occur at the interface between the dissimilar metallic layer 51 and the first metal wiring layer 21 at the bottom portion of the via hole, and at the interface between the dissimilar metallic layer 52 and the second metal wiring layer 22, because of thermal stress occurring due to differences in thermal expansion coefficients between the insulating layers and the metal wiring layers. The configuration shown in FIG. 2 requires improvement in the connection reliability of the via connections.

For solving the problem of thermal stress applied to such via holes, for example, there have been conventionally suggested techniques described in PTL 1 and PTL 2. PTL 1 discloses a multilayer wiring board having at least one through hole filled with low modulus filler around a via hole for electrically connecting the metal wiring layers with insulating layers interposed therebetween, and a method of producing the same. PTL 2 discloses a multilayer wiring board in which one or more dummy via holes not connected to a circuit pattern are formed near a via hole, and a method of producing the same.

[Citation List] [Patent Literature] [PTL 1] JP 2002-314256 A; [PTL 2] JP 2002-319767 A.

SUMMARY OF THE INVENTION

Technical Problem

However, in PTL 1 and PTL 2, there is a problem that through holes or non-through holes which does not involve in electrical connection must be formed, which increases the complexity of the producing process.

The present invention has been devised in view of the foregoing problem, and an object of the present invention is to improve the reliability of connection of via hole connection portions in a simpler manner.

Solution to Problem

To solve the problem, an aspect of the present invention is to provide a multilayer wiring board comprising a plurality of metal wiring layers alternately laminated with an insulating layer interposed therebetween are electrically connected to each other via a via hole plated layer formed on a surface of a via hole. The multilayer wiring board includes a dissimilar metallic layer, made from material different from that of the metal wiring layers, interposed between each of the metal wiring layers on the bottom surface of the via hole and the via hole plated layer. A concave portion is formed in each of the metal wiring layers on the bottom surface of the via hole at a position in contact with the dissimilar metallic layer. The dissimilar metallic layer is arranged in a concave shape on a surface of the concave portion formed in each of the metal wiring layers on the bottom surface of the via hole.

Advantageous Effects of the Invention

According to the aspect of the present invention, it is possible to provide a multilayer wiring board in which the connection reliability of the via hole connection portion is improved in a simpler manner.

DETAILED DESCRIPTION

Embodiments of the present invention will be described below with reference to the drawings. In the following description of the drawings to be referred, components or functions identical with or similar to each other are given the same or similar reference signs, unless there is a reason not to. It should be noted that the drawings are only schematically illustrated, and thus the relationship between thickness and two-dimensional size of the components, and the thickness ratio between the layers, are not to scale. Therefore, specific thicknesses and dimensions should be understood in view of the following description. As a matter of course, dimensional relationships or ratios may be different between the drawings.

Further, the embodiments described below are merely examples of configurations for embodying the technical idea of the present invention. The technical idea of the present invention does not limit the materials, shapes, structures, arrangements, and the like of the components to those described below. The technical idea of the present invention can be modified variously within the technical scope defined by the claims. The present invention is not limited to the following embodiments within the scope not departing from the spirit of the present invention. For the sake of clarity, the drawings may be illustrated in an exaggerated manner as appropriate.

In any group of successive numerical value ranges described in the present specification, the upper limit value or lower limit value of one numerical value range may be replaced with the upper limit value or lower limit value of another numerical value range. In the numerical value ranges described in the present specification, the upper limit values or lower limit values of the numerical value ranges may be replaced with values shown in examples. The configuration according to a certain embodiment may be applied to other embodiments.

Hereinafter, an embodiment of the present invention will be described with reference to the drawings.

Figure 3:
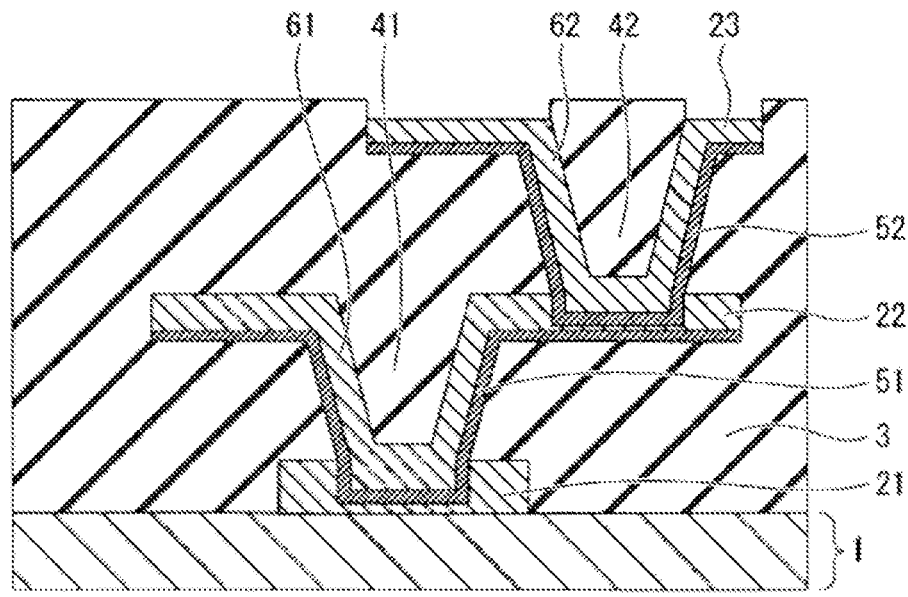
FIG. 3 is a partial enlarged cross-sectional view of an example of a multilayer wiring board according to an embodiment of the present invention.

FIG. 3 is a partial enlarged cross-sectional view of an example of multilayer wiring board according to the present embodiment.

FIG. 3 illustrates a case where a via hole is a conformal via. However, the present invention can be implemented even in a case where the via hole is a filled via.

Configuration

A core substrate 1 is obtained by forming an insulating material such as glass epoxy resin, glass, or ceramic in a plate shape.

Figure 1:
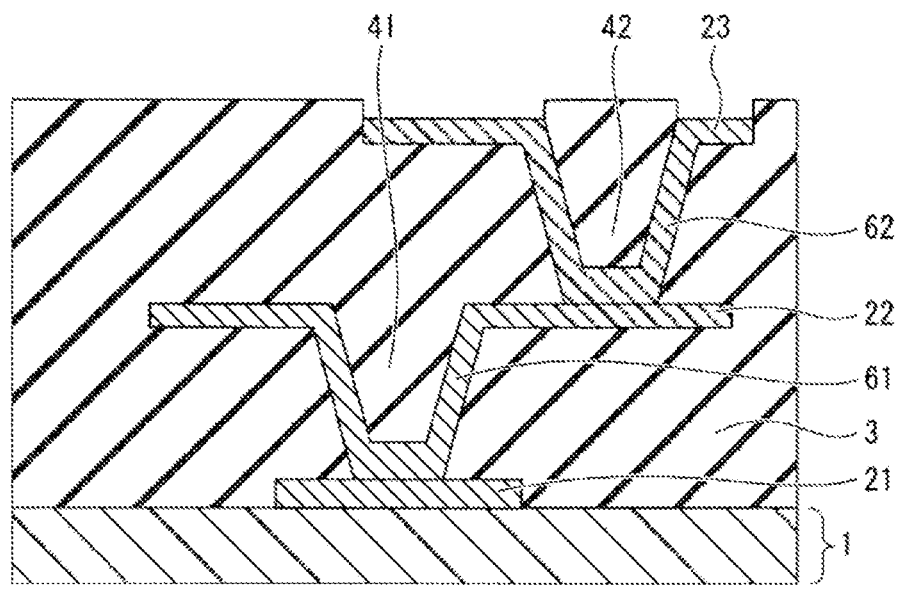
FIG. 1 is an enlarged cross-sectional view of a multilayer wiring board in which circuit patterns on layers and interlayer connection wires are formed of the same type of metallic material, in a conventional example.
Figure 2:
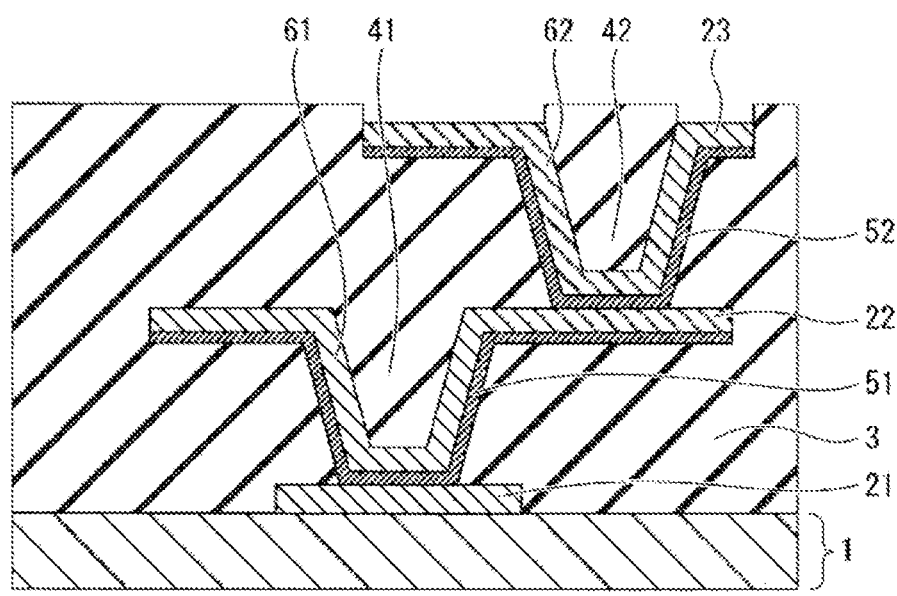
FIG. 2 is an enlarged cross-sectional view of a multilayer wiring board formed of two or more types of metallic material in a conventional example.

In the example shown in FIG. 3, the multilayer wiring board has three conductive layers (metal wiring layers) formed on one side (upper surface in FIG. 1) of the core substrate 1. Specifically, on the upper surface of the core substrate 1, a first metal wiring layer, a second metal wiring layer, and a third metal wiring layer, which are made of, for example, copper are laminated in this order with insulating layers interposed therebetween. FIG. 3 illustrates a structure having the core substrate 1. However, the multilayer wiring board of the present invention is also applicable to a structure without a core substrate, that is, a structure having wiring layers stacked on an interposer.

The method of producing the first metal wiring layer 21 is not particularly limited. However, a semi-additive process is preferable in that a substrate with high wiring density can be produced in a simple manner. To explain an example of the production method, a first seed layer is formed on the core substrate 1 by sputter coating of Ti and Cu, electroless Ni plating, Cu plating, or the like, and a photoresist layer is formed on the first seed layer. The photoresist may be a positive or negative liquid resist or a dry film resist. However, the photoresist is preferably a dry film resist because it is convenient and less expensive. After being formed, the resist layer is exposed to light to form a first plated resin pattern thereon using a photomask in which a desired wiring pattern is drawn or a direct imaging apparatus for directly transferring a desired wiring pattern to the resist layer. After the first plated resist pattern is formed, electrolytic copper plating is performed. Then, the first plated resist pattern that is no longer needed is removed, and the first seed layer that is no longer needed is etched away to form the first metal wiring layer 21.

Next, in the present embodiment, an insulating layer 3 is formed on the first metal wiring layer 21.

The insulating layer 3 is formed of a resin material such as a photosensitive polyimide resin, a photosensitive polybenzoxazole resin, a polyimide resin, an epoxy resin, a bismaleimide triazine resin, a cyanate resin, a polyphenylene oxide, a liquid crystal polymer, or a silicone resin, or a composite material of these materials. The use of a photosensitive polyimide resin or a photosensitive polybenzoxazole resin is preferable in that the formation of a fine pattern with excellent heat resistance and electrical characteristics is easy.

Although not particularly limited, the insulating layer 3 may preferably have a thickness in the range of 0.5 µm or more and 30 µm or less. If the thickness of the insulating layer 3 is smaller than 0.5 µm, the reliability of insulation between the metal wiring layers may be deteriorated. On the other hand, if the thickness of the insulating layer 3 is larger than 30 µm, it is disadvantageous for forming a fine circuit.

If the insulating layer 3 is in a sheet form, the method for forming the insulating layer 3 on the core substrate 1 may be roll lamination, vacuum lamination, or the like. If the insulating layer 3 is produced from a liquid varnish, the insulating layer 3 can be formed by a known method such as spin coating, die coating, curtain coating, or roller coating.

Next, a via hole 41 is formed for electrically connecting the first metal wiring layer 21 and the second metal wiring layer 22. The via hole 41 is formed by photolithography or by ablating the insulating layer 3 with a laser beam.

Although not particularly limited, the via hole may have a diameter in the range of 2 µm or more and 100 µm or less. If the diameter of the via hole is smaller than 2 µm, the reliability of the via connections may be deteriorated. On the other hand, if the diameter of the via hole is larger than 100 µm, it is disadvantageous for forming a fine circuit.

Figure 4:
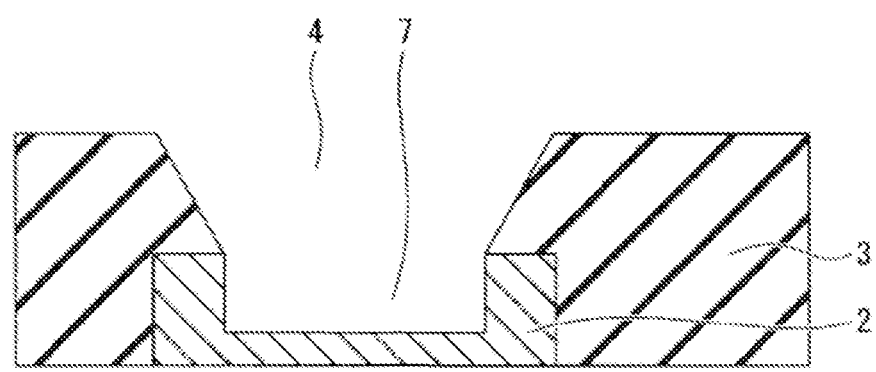
FIG. 4 is a partial enlarged cross-sectional view of a bottom portion of a via hole in a multilayer wiring board according to an embodiment of the present invention.
Figure 5:
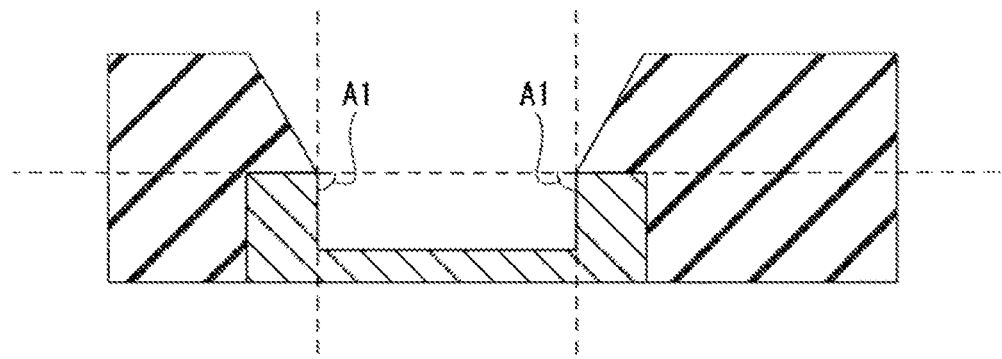
FIG. 5 is a partial enlarged cross-sectional view of a bottom portion of a via hole in a multilayer wiring board according to an embodiment of the present invention.
Figure 7:
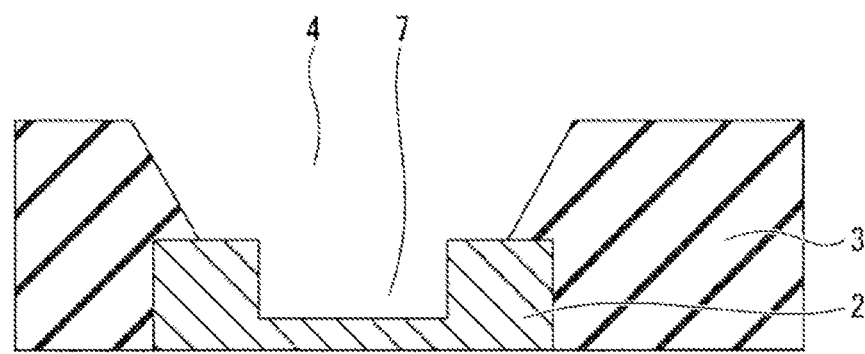
FIG. 7 is a partial enlarged cross-sectional view of a bottom portion of a via hole in a multilayer wiring board according to an embodiment of the present invention.
Figure 8:
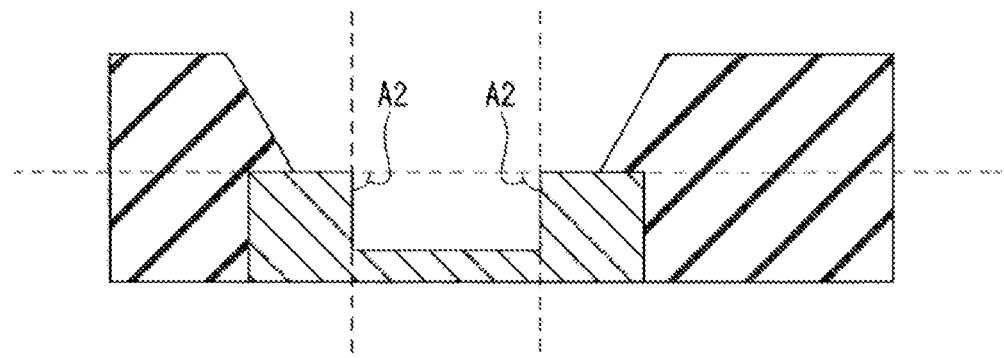
FIG. 8 is a partial enlarged cross-sectional view of a bottom portion of a via hole in a multilayer wiring board according to an embodiment of the present invention.

Next, oxygen plasma treatment is applied to the insulating layer 3 in which the via hole 41 is formed. Then, a treatment for removing smears from the bottom surface of the via hole 41 and roughening the surface of the insulating layer 3 is applied. Thereafter, the metal wiring pattern exposed on the bottom surface of the via hole is etched away to form a concave portion 7 as illustrated in FIG. 4 or FIG. 7 in the top surface of the first metal wiring layer 21. The etching is preferably dry etching by an ion gun or Ar plasma because the concave portion can be formed with high yield. The concave portion 7 formed in the first metal wiring layer 21 is preferably etched perpendicularly to the core substrate 1. The angle of a wall surface of the concave portion 7 is an angle A1 illustrated in FIG. 5 or an angle A2 illustrated in FIG. 8. The angle A1 is an angle formed between the wall surface of the concave portion 7 of the metal wiring layer on the bottom surface of the via hole and the metal wiring-insulating layer interface (synonymous with the upper surface of the core substrate 1). The angle A2 is an angle formed between the wall surface of the concave portion 7 of the metal wiring layer on the bottom surface of the via hole and the upper surface of the core substrate 1. The angle A1 or A2 is preferably in the range of 75 degrees or more and 105 degrees or less. If the angle A1 or A2 is smaller than 75 degrees, in a case when the insulating layer thermally expands and contracts, the force applied to the horizontal direction of the wiring board cannot be reduced, and thus the effect of preventing the removal of the via hole plated layer and the metal wiring layer on the bottom surface of the via hole may be deteriorated. On the other hand, if the angle A1 or A2 is larger than 105 degrees, the dissimilar metallic layer to be formed in the next step may not be continuously formed on the wall surface of the concave portion.

The angle A1 or A2 is preferably closer to 90 degrees than the inclination angle along the axial direction of a wall surface of a via hole, in side view.

The concave portion 7 formed on the bottom portion of the via hole by the dry etching may preferably have a depth in the range of 10 nm or more and 500 nm or less. If the depth of the concave portion is smaller than 10 nm, the depth of the concave portion embedded in the metal wiring layer on the bottom surface of the via hole becomes smaller, and thus the effect of preventing the removal of the via hole plated layer and the metal wiring layer on the bottom surface of the via hole may be deteriorated. On the other hand, if the depth of the concave portion is larger than 500 nm, the amount of dry etching becomes large, which makes it difficult to form the concave portion with high yield. The concave portion may more preferably have a depth in the range of 50 nm or more and 500 nm or less.

Figure 6:
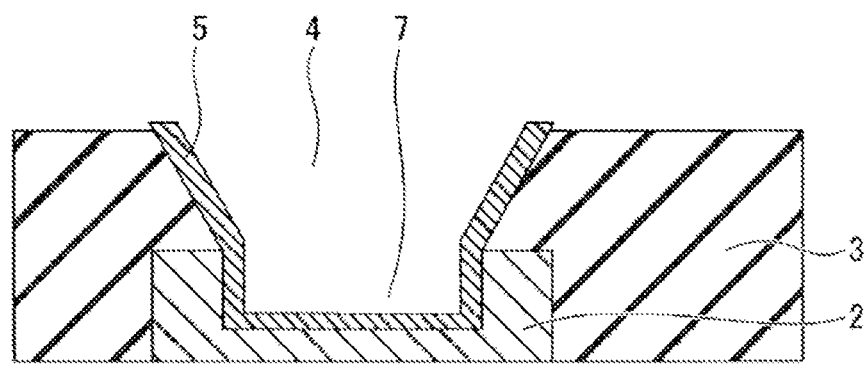
FIG. 6 is a partial enlarged cross-sectional view of a bottom portion of a via hole in a multilayer wiring board according to an embodiment of the present invention.

FIG. 4 is a partial enlarged cross-sectional view of the bottom portion of the via hole of the multilayer wiring board of the present embodiment. By etching the metal wiring pattern made of the metal wiring layer exposed to the bottom surface of the via hole, the bottom end portion of the wall surface of the via hole and the upper end portion of the wall surface of the concave portion 7 formed in the metal wiring layer on the bottom surface of the via hole become directly continuous without any level difference therebetween, as illustrated in FIG. 4. For example, the opening in the bottom surface of the via hole and the opening of the concave portion 7 formed in the metal wiring layer on the bottom surface of the via hole have the same diameter and shape. When forming a dissimilar metallic layer 5 on the wall surface of the via hole and on the bottom surface and the wall surface of the concave portion 7 as illustrated in FIG. 4, the configuration illustrated in FIG. 6 is obtained.

As another method, there is a structure as illustrated in FIG. 7. FIG. 7 is a partial enlarged cross-sectional view of another bottom portion of the via hole of the multilayer wiring board of the present embodiment.

As illustrated in FIG. 7, the area of the opening in the bottom surface of the via hole may be larger than the cross-sectional area of the opening of the concave portion 7 formed in the upper surface of the metal wiring layer on the bottom surface of the via hole.

For example, the width of the concave portion 7 may be smaller than the diameter of the bottom surface of the via hole. The bottom end portion of the wall surface of the via hole is arranged outside the upper end portion of the wall surface of the concave portion 7 formed in the metal wiring layer. Thus, the bottom end portion of the wall surface of the via hole and the upper end portion of the wall surface of the concave portion 7 indirectly connect via the upper surface of the metal wiring layer.

With the configuration as illustrated in FIG. 7, the dissimilar metallic layer 5 can be formed uniformly on the wall surface of the via hole 4 and the concave portion 7 on the bottom surface of the via hole. As a method for forming the dissimilar metallic layer 5, the via hole in which the concave portion 7 is formed may be immersed in oxygen plasma or an etching liquid to etch the insulating layer 3 arranged on the wall surface of the via hole. The opening diameter of the concave portion formed in the metal wiring pattern on the bottom surface of the via hole with respect to the opening diameter of the bottom surface of the via hole is preferably in the range of 50% or more and 100% or less. If the ratio of the opening diameter is not in the range of 50% or more and 100% or less, it may be difficult to form the dissimilar metallic layer on the concave portion.

Figure 9:
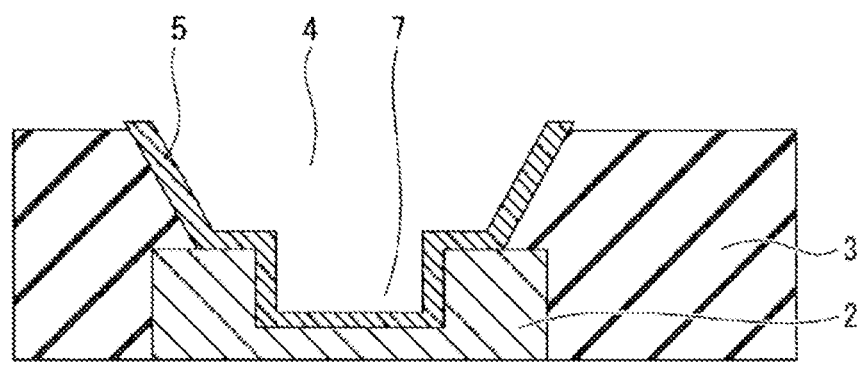
FIG. 9 is a partial enlarged cross-sectional view of a bottom portion of a via hole in a multilayer wiring board according to an embodiment of the present invention.

When forming the dissimilar metallic layer 5 on the wall surface of the via hole 4 and on the bottom surface and wall surface of the concave portion 7 as illustrated in FIG. 7, the configuration illustrated in FIG. 9 is obtained.

Figure 10:
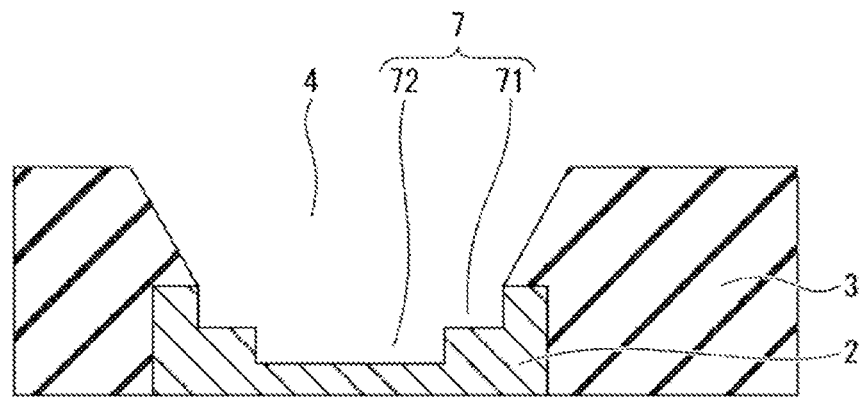
FIG. 10 is a partial enlarged cross-sectional view of a bottom portion of a via hole in a multilayer wiring board according to an embodiment of the present invention.

As a still another method, there is a structure illustrated in FIG. 10. FIG. 10 is a partial enlarged cross-sectional view of another via hole bottom portion of the multilayer wiring board of the present embodiment. FIG. 10 illustrates an example of the concave portion 7 having a multilevel structure in which the cross-sectional area of the opening of the concave portion increases stepwise from the bottom surface of the concave portion toward the via hole arranged above the concave portion. The concave portion 7 may have a multilevel structure in which the opening width becomes narrow, like a stair, toward the lower portion (the bottom side). For example, a concave shape consisting of an upper first concave portion 71 and a lower second concave portion 72 may be formed in the metal wiring layer 2 on the bottom surface of the via hole. The wall surface of the first concave portion 71 become continuous with the wall surface of the via hole 4, thereby forming the second concave portion 72 in the first concave portion 71. With the configuration as illustrated in FIG. 10, the dissimilar metallic layer 5 can be formed more uniformly on the wall surface of the via hole and the concave portion 7 on the bottom surface of the via hole. Because the contact area between the metal wiring layer 2 and the dissimilar metallic layer 5 on the bottom surface of the via hole becomes large, the reliability of the via connections can be improved. In this case, a forming method can be such as forming an etching resist pattern after the via hole formation so that only the desired part is etched. The ratio of the opening diameter of the second concave portion 72 relative to the first concave portion 71 is preferably in the range of 50% or more and 100% or less. If the ratio of the opening diameter is not in the range of 50% or more and 100% or less, it may be difficult to form the dissimilar metallic layer on the concave portion 7.

Figure 11:
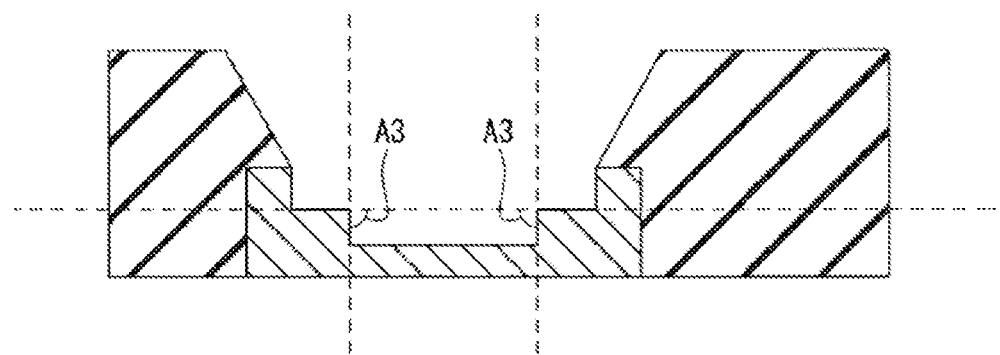
FIG. 11 is a partial enlarged cross-sectional view of a bottom portion of a via hole in a multilayer wiring board according to an embodiment of the present invention.

Preferably, the second concave portion 72 is vertically etched. The angle, such as angle A3 illustrated in FIG. 11, formed between the wall surface of the second concave portion 72 of the metal wiring layer on the bottom surface of the via hole and the metal wiring layer parallel to the upper surface of the core substrate is in a range of 75 degrees or more and 105 degrees or less. If the angle A3 is smaller than 75 degrees, when the insulating layer thermally expands and contracts, the force applied to the horizontal direction of the wiring board cannot be reduced, and thus the effect of preventing the removal of the via hole plated layer and the metal wiring layer on the bottom surface of the via hole may be deteriorated. On the other hand, if the angle A3 is larger than 105 degrees, the dissimilar metallic layer to be formed in the next step may not be continuously formed on the wall surface of the second concave portion.

Figure 12:
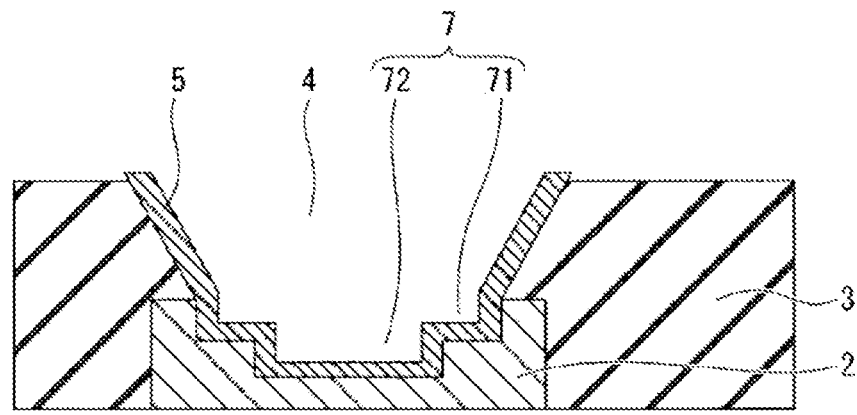
FIG. 12 is a partial enlarged cross-sectional view of a bottom portion of a via hole in a multilayer wiring board according to an embodiment of the present invention.

The second concave portion 72 may preferably have a depth in the range of 10 nm or more and 500 nm or less. If the depth of the second concave portion 72 is smaller than 10 nm, the depth of the second concave portion embedded in the metal wiring layer 2 on the bottom surface of the via hole may become shallow, and thus the effect of preventing the removal of the via hole plated layer 61 and the metal wiring layer 2 on the bottom surface of the via hole may be deteriorated. On the other hand, if the depth of the second concave portion 72 is larger than 500 nm, the amount of dry etching becomes large, which makes it difficult to form the second concave portion 72 with high yield. The second concave portion 72 may more preferably have a depth in the range of 50 nm or more and 500 nm or less. When forming the dissimilar metallic layer 5 on the wall surface of the via hole and on the bottom surface and wall surface of the concave portion 7 as illustrated in FIG. 10, the configuration as illustrated in FIG. 12 is obtained.

Next, the dissimilar metallic layer 51 is formed on the bottom surface and inner wall surface of the via hole in which the concave portion 7 is formed, and on the surface of the insulating layer. The dissimilar metallic layer may be Ti, Ni, Ag, Sn, Au, or the like, but Ti is preferable because of its high strength and resistance to thermal expansion and contraction. The method for forming the dissimilar metallic layer 5 may be sputtering, CVD, vapor deposition, ion plating, electroless plating, or the like, but sputtering is convenient and practical. By forming the dissimilar metallic layer on the metal wiring layer on the bottom surface of the via hole having the concave portion 7, the dissimilar metallic layer having a concave shape is formed so as to be embedded in the metal wiring layer 2 on the bottom surface of the via hole.

Next, the via hole plated layer 61 and the second metal wiring layer 22 are produced. The method for producing the via hole plated layer 61 and the second metal wiring layer 22 is not particularly limited. However, a semi-additive process is preferable in that a substrate with high wiring density can be produced in a simple manner. An example of the production method will be described. First, the formed dissimilar metallic layer 51 is used as a seed layer for forming a photoresist layer on the dissimilar metallic layer. Next, the photoresist layer is exposed to light to form a first plated resin pattern thereon using a photomask in which a desired wiring pattern is drawn or a direct imaging apparatus for transferring a desired wiring pattern to the photoresist layer. After the plated resist pattern is formed, electrolytic copper plating is performed, and the unnecessary portions of the plated resist pattern is removed. The upper portion of the dissimilar metallic layer 51 where no wiring pattern is formed becomes unnecessary and thus is removed by etching. Accordingly, the via hole plated layer 61 and the second metal wiring layer 22 are formed.

Next, the insulating layer 3 is formed, and then the via hole 42 is formed for electrically connecting the second metal wiring layer 22 and the third metal wiring layer 23. Further, oxygen plasma treatment is applied to the insulating layer 3 in which the via hole 42 is formed. Then, a treatment for removing smears from the bottom surface of the via hole and for roughening the insulating layer surface is applied, followed by etching the metal wiring pattern exposed on the bottom surface of the via hole, thereby forming a concave portion in the second metal wiring layer 22.

Next, the dissimilar metallic layer 52 is formed on the bottom surface and the inner wall surface of the via hole having the concave portion and on the surface of the insulating layer, and then the via hole plated layer 62 and the third metal wiring layer 23 are produced.

An example of production thereof will be described. First, using the formed dissimilar metallic layer 52 as a seed layer, a photoresist layer is formed on the dissimilar metallic layer. Then, the photoresist layer is exposed to light to form a first plated resin pattern thereon using a photomask in which a desired wiring pattern is drawn or a direct imaging apparatus for transferring a desired wiring pattern to the photoresist layer. After the plated resist pattern is formed, electrolytic copper plating is performed on the plated resist pattern to remove unnecessary portions from the plated resist pattern. Then, the upper portion of the dissimilar metallic layer 52 where no wiring pattern is formed becomes unnecessary and thus is removed by etching. Accordingly, the via hole plated layer 62 and the third metal wiring layer 23 are formed.

Operation and Others

When the thermal stress due to thermal expansion and contraction is applied to the multilayer wiring board of the present embodiment formed as above, the thermal stress due to thermal expansion and contraction in the horizontal direction of the multilayer wiring board is also applied to the via hole plated layer formed on the inner wall surface of the via hole 4, and a load which might result in ruptures will be applied to this plated layer. In the present embodiment, the via hole plated layer is formed on the dissimilar metallic layer 5, and further, the dissimilar metallic layer 5 is embedded into the metal wiring layer 2 on the bottom surface of the via hole. Accordingly, the via hole plated layer and the metal wiring layer on the bottom surface of the via hole engage with each other with the dissimilar metallic layer interposed therebetween. This prevents the removal of the via hole plated layer and the metallic wire joint portion at via hole bottom. Therefore, in the present embodiment, it is possible to improve reliability of connection between the metal wiring layers.

The multilayer wiring board of the present embodiment as above can achieve excellent working effects as described below.

In the present embodiment, the multilayer wiring board is configured such that a plurality of metal wiring layers alternately laminated with an insulating layer interposed therebetween are electrically connected to each other via a via hole plated layer formed on a surface of a via hole. The multilayer wiring board includes a dissimilar metallic layer, made from material different from that of the metal wiring layers, interposed between each of the metal wiring layers on the bottom surface of the via hole and the via hole plated layer. A concave portion is formed in each of the metal wiring layers on the bottom surface of the via hole at a position in contact with the dissimilar metallic layer. The dissimilar metallic layer is arranged in a concave shape on a surface of the concave portion formed in each of the metal wiring layers on the bottom surface of the via hole.

According to this configuration, in the multilayer wiring board in which the metal wiring layers sandwiching the insulating layers are electrically connected to each other with the via hole plated layer interposed therebetween, at least one type of dissimilar metallic layer is formed in a concave shape between the metal wiring layer on the bottom surface of the via hole and the via hole plated layer. The dissimilar metallic layer is embedded in the metal wiring layer on the bottom surface of the via hole. As a result, the metal wiring layer on the bottom surface of the via hole and the via hole plated layer electrically connecting the wiring layers engage with each other with the dissimilar metallic layer interposed therebetween. This engagement prevents removal of the via hole plated layer from the metal wiring layer on the bottom surface of the via hole, and improvement in the reliability of connection of the via hole connection portion.

The dissimilar metallic layer may preferably have a thickness in the range of 5 nm or more and 100 nm or less.

The concave portion may preferably have a depth in the range of 10 nm or more and 500 nm or less.

The angle of the wall surface of the concave portion with respect to the surface of the substrate on which the metal wiring layers are formed is preferably in the range of 75 degrees or more and 105 degrees or less.

In the present embodiment, at least a part of the dissimilar metallic layer may be formed on the surface of the via hole. The at least part of the dissimilar metallic layer including a first layer and a second layer. The first layer formed on the concave portion may be electrically connected to the second layer formed on the wall surface of the via hole.

In the present embodiment, the bottom end portion of the wall surface of the via hole formed in the insulating layer may be directly continuous with the upper end portion of the concave portion.

In the present embodiment, the via hole has an opening in the bottom of the via hole formed in the insulating layer which is wider than an opening of the concave portion. The dissimilar metallic layer including the first layer, the second layer, and a third layer. The first layer formed on the concave portion and the second layer formed on the wall surface of the via hole may be electrically connected via the third layer formed on the upper surface of the metal wiring layer on the bottom surface of the via hole.

In the present embodiment, the concave portion may have a multilevel structure in which the cross-sectional area of the opening of the concave portion increases stepwisely from the bottom surface of the concave portion toward the via hole.

For example, the multilevel structure is a two-level structure.

In the present embodiment, each of the metal wiring layer and the via hole plated layer may contain copper as a material.

In the present embodiment, the dissimilar metallic layer may contain titanium as a material.

In the present embodiment, the dissimilar metallic layer may contain nickel as a material.

The above-described multilayer wiring board is produced, for example, as described below.

A method for producing a multilayer wiring board employed in the present embodiment includes the steps of: forming a first seed layer by performing sputtering on a main surface that is a surface of a core substrate; forming a first plated resist pattern on the first seed layer; forming a first metal wiring layer by electrolytic plating; removing the first plated resist pattern from the first seed layer; etching the first seed layer other than the first metal wiring layer; forming an insulating layer to cover the first metal wiring layer; forming a bottomed hole in a portion of the insulating layer which is located on the first metal wiring layer, the bottomed hole to be a via hole and having an opening to partially expose an upper portion of the first metal wiring layer; applying oxygen plasma treatment to the upper portion of the first metal wiring layer, which is exposed, to clean the opening; applying argon ion gun treatment to the opening, which is cleaned, and etch the first metal wiring layer in the opening to form a concave portion at a bottom of the opening; forming a second seed layer in a form of a dissimilar metallic layer on the insulating layer having the concave portion over the opening at the bottom, the dissimilar metallic layer being different in material from the first metal wiring layer; forming a dissimilar metallic layer on the concave portion simultaneously when forming the second seed layer to make the dissimilar metallic layer having a concave shape; forming a second plated resist pattern on the second seed layer; forming a pattern of a second metal wiring layer by electrolytic plating; and removing the second plated resist layer that is no longer needed after forming the pattern of the second metal wiring layer and removing an unnecessary portion of the second seed layer by etching.

Alternatively, a method for producing a multilayer wiring board employed in the present embodiment includes the steps of: forming a first seed layer by performing sputtering on a main surface that is a surface of a core substrate; forming a first plated resist pattern on the first seed layer; forming a first metal wiring layer by electrolytic plating; removing the first plated resist pattern from the first seed layer; etching the first seed layer other than the first metal wiring layer; forming an insulating layer to cover the first metal wiring layer; forming a bottomed hole in a portion of the insulating layer which is located on the first metal wiring layer, the bottomed hole to be a via hole and having an opening to partially expose an upper portion of the first metal wiring layer; applying oxygen plasma treatment to the upper portion of the first metal wiring layer, which is exposed, to clean the opening; performing reverse sputtering on the opening, which is cleaned, and etch the first metal wiring layer in the opened portion to form a concave portion at a bottom of the opened portion; forming a second seed layer in a form of a dissimilar metallic layer on the insulating layer having the concave portion over the opening at the bottom, the dissimilar metallic layer being different in material from the first metal wiring layer; forming a dissimilar metallic layer on the concave portion simultaneously when forming the second seed layer to make the dissimilar metallic layer having a concave shape; forming a second plated resist pattern on the second seed layer; forming a pattern of a second metal wiring layer by electrolytic plating; and removing the second plated resist layer that is no longer needed after forming the pattern of the second metal wiring layer and removing an unnecessary portion of the second seed layer by etching.

Example

Next, an example based on the present embodiment will be described with reference to FIGS. 13(A) to 13(I).

Figure 13A:
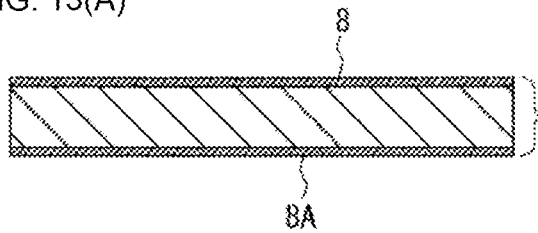
FIGS. 13(A) to 13(I) are explanatory diagrams describing an example of a multilayer wiring board.

In the present example, as illustrated in FIG. 13(A), thin metallic layers (first seed layers) 8 and 8A are formed on both sides of the core substrate 1. The first seed layers are formed by colliding the ionized and accelerated atoms or molecules with the specimen surface. Then, 300 nm thick Cu films were formed as the first seed layers 8 and 8A on the core substrate 1.

Figure 13B:
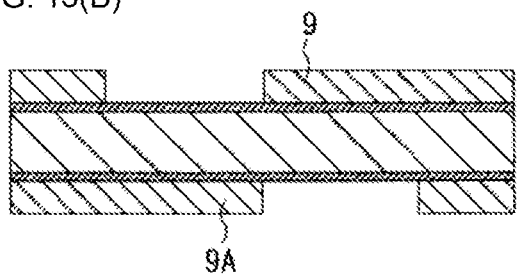

Next, as illustrated in FIG. 13(B), first plated resist patterns 9 and 9A are formed on the first seed layers 8 and 8A. The resist patterns were each formed by laminating a dry film resist of 25 μm thickness, exposing the resist to light using a photomask in which a pattern corresponding to a wiring circuit was drawn, and then subjecting the resist to spray development with a 1% sodium carbonate water solution. Accordingly, the first plated resist patterns 9 and 9A were formed on the core substrate 1.

Figure 13C:
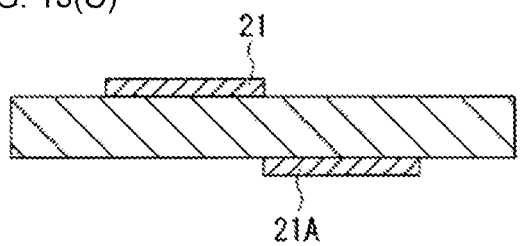

As illustrated in FIG. 13(C), the substrate was coated with electrolytic copper plating of 1 μm thickness using the first seed layers as power feed layers. Then, the first plated resist patterns that are no longer needed were removed by spraying a 3% sodium hydroxide solution at 60° C. Further, the unnecessary portions of the first seed layers were removed by a sulfuric acid and hydrogen peroxide aqueous solution, thereby forming first metal wiring layers 21 and 21A.

Figure 13D:
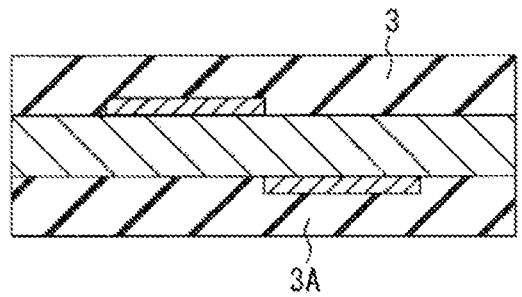
Figure 13E:
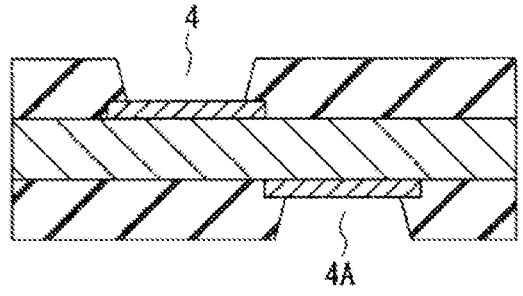

Next, as illustrated in FIGS. 13(D) and 13(E), insulating layers 3 and 3A and via holes 4 and 4A were formed. Specifically, the wiring substrate on which the first metal wiring layers 21 and 21A are formed was immersed in a 10% sulfate solution and cleansed, and was coated with HD-4104 (produced by Hitachi Chemical DuPont Microsystems Ltd) by spin coating and was pre-baked. Then, the substrate was exposed to light except for the portions corresponding to the via holes 4 and 4A by using a direct imaging apparatus, and was subjected to organic development and cured, thereby forming the insulating layers 3 and 3A of 5 μm thickness and the via holes 4 and 4A. After the via holes 4 and 4A are formed, oxygen plasma treatment is performed, and a treatment for removing smears from the bottom portion of the via holes 4 and 4A and for roughening the surfaces of the insulating layers is applied.

Figure 13F:
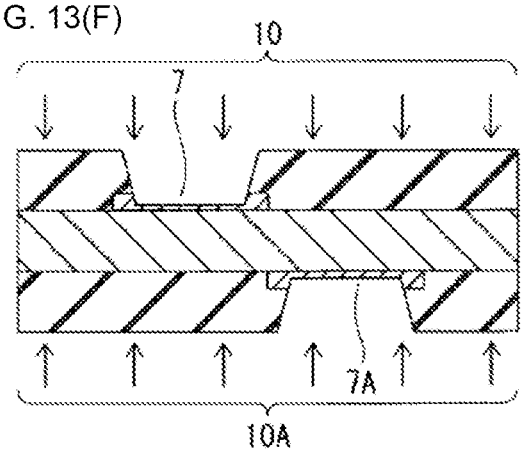
Figure 13G:
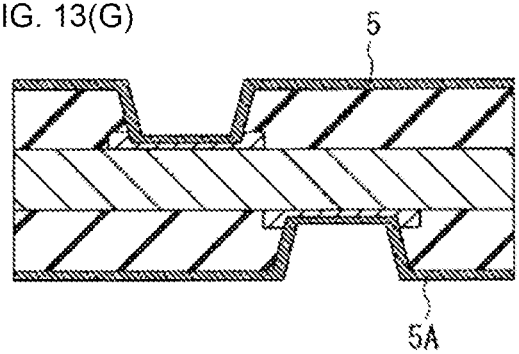

Next, as illustrated in FIGS. 13(F) and 13(G), after the oxygen plasma treatment, argon ion gun treatments (dry etching treatments) 10 and 10A were applied to the front and back surfaces of the wiring board to form concave portions 7 and 7A in the first metal wiring layers 21 and 21A exposed from the bottom portions of the via hole. Subsequently, dissimilar metallic layers 5 and 5A were formed on the via holes 4 and 4A in which the concave portions 7 and 7A are formed at the bottom portions of the via hole, and on the surfaces of the insulating layers. As the dissimilar metallic layers 5 and 5A, 50 nm thick Ti films were formed using a sputtering apparatus, and the dissimilar metallic layers 5 and 5A were used as seed layers for electrolytic copper plating. In this manner, the dissimilar metallic layers 5 and 5A were embedded in the first metal wiring layers 21 and 21A at the bottoms of the via holes.

Figure 13H:
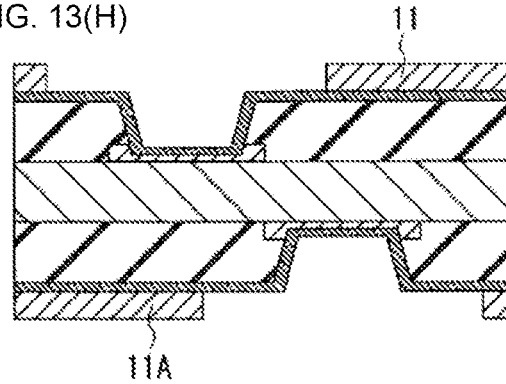

Next, as illustrated in FIG. 13(H), second plated resist patterns 11 and 11 A are formed by laminating a dry film resist of 25 μm thickness on the dissimilar metal layer 5, performing exposure processing using a photomask in which a pattern corresponding to a wiring circuit is drawn, and then performing spray development processing with a 1% sodium carbonate aqueous solution.

Figure 13I:
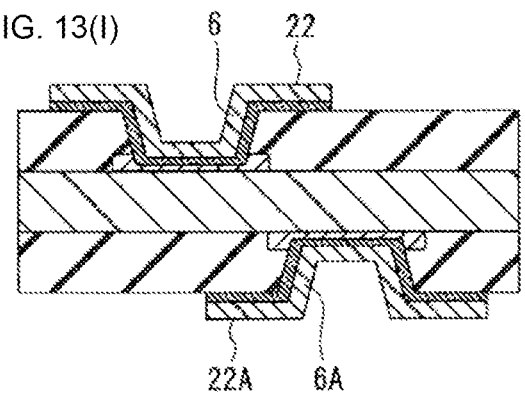

Next, as illustrated in FIG. 13(I), the wiring substrate on which the second plated resist patterns were formed was coated with electrolytic copper plating of 15 μm thickness using the dissimilar metallic layers 5 and 5A as power feed layers. Then, the second plated resist patterns that are no longer needed were removed by spraying a 3% sodium hydroxide aqueous solution at 60° C. Further, unnecessary portions of the dissimilar metallic layers 5 and 5A were removed by a Ti etching solution, thereby forming via hole plated layers 6 and 6A in the via holes in which concave portions are formed simultaneously when forming second metal wiring layers 22 and 22A.

The present invention is not limited to the example described above and illustrated in the drawings but can be modified in various forms without departing from the gist of the present invention.

Although the multilayer wiring board of the example has been described in the case where the metal wiring layers has four metal wiring layers, it can be widely applied to wiring boards with even more layers, such as six or eight metal wiring layers.

[Reference Signs List] 1 . . . Core substrate (inner layer substrate); 2 . . . Metal wiring layer; 21 . . . First metal wiring layer; 22 . . . Second metal wiring layer; 23 . . . Third metal wiring layer; 3 . . . Insulating layer; 4 . . . Via hole; 41 . . . First via hole; 42 . . . Second via hole; 5 . . . Dissimilar metallic layer; 51 . . . First dissimilar metallic layer; 52 . . . Second dissimilar metallic layer; 6 . . . Via hole plated layer; 61 . . . First via hole plated layer; 62 . . . Second via hole plated layer; 7 . . . Concave portion; 71 . . . First concave portion; 72 . . . Second concave portion; 8 . . . First seed layer; 9 . . . First plated resist pattern; 10 . . . Conceptual diagram of dry etching; 11 . . . Second plated resist pattern; A1 . . . Angle formed between wall surface of concave portion of metal wiring layer on bottom surface of via hole and metal wiring-insulating layer interface; A2 . . . Angle formed between wall surface of concave portion of metal wiring layer on bottom surface of via hole and metallic layer parallel to the direction of wiring board; A3 . . . Angle formed between wall surface of second concave portion of metal wiring layer on bottom surface of via hole and metallic layer parallel to the direction of wiring board.

What is claimed is:

1. A multilayer wiring board, comprising:
a plurality of metal wiring layers alternately laminated with an insulating layer interposed therebetween are electrically connected to each other via a via hole plated layer formed on a surface of a via hole, wherein
a dissimilar metallic layer, made from material different from that of the metal wiring layers, is interposed between each of the metal wiring layers on a bottom surface of the via hole and the via hole plated layer,
a concave portion is formed in each of the metal wiring layers on the bottom surface of the via hole at a position in contact with the dissimilar metallic layer, and
the dissimilar metallic layer is arranged in a concave shape on a surface of the concave portion which is formed in each of the metal wiring layers on the bottom surface of the via hole, wherein the concave portion has a multilevel structure in which a cross-sectional area of an opening of the concave portion increases stepwisely from the bottom surface of the concave portion toward the via hole, and wherein the multilevel structure comprises (a) a first level comprising the bottom surface, the first level has a first diameter of the opening and (a) a second level having a second diameter of the opening, wherein the first diameter is between 50% and 100% of the second diameter.

2. The multilayer wiring board of claim 1, wherein the multilevel structure is a two-layer structure consisting of the first level and the second level.

\* \* \* \* \*